United States Patent
Kamal et al.

(10) Patent No.: US 8,836,040 B2
(45) Date of Patent: Sep. 16, 2014

(54) SHARED-DIFFUSION STANDARD CELL ARCHITECTURE

(71) Applicant: QUALCOMM Incorporated, San Diego, CA (US)

(72) Inventors: Pratyush Kamal, San Diego, CA (US); Esin Terzioglu, San Diego, CA (US); Foua Vang, Lemon Grove, CA (US); Prayag Bhanubhai Patel, San Diego, CA (US); Giridhar Nallapati, San Diego, CA (US); Animesh Datta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/671,114

(22) Filed: Nov. 7, 2012

(65) Prior Publication Data

US 2014/0124868 A1     May 8, 2014

(51) Int. Cl.
H01L 21/70 (2006.01)
H01L 21/8238 (2006.01)
H01L 29/66 (2006.01)
H01L 27/118 (2006.01)
H01L 27/02 (2006.01)
H01L 27/092 (2006.01)

(52) U.S. Cl.
CPC ........ *H01L 27/092* (2013.01); *H01L 29/66545* (2013.01); *H01L 27/11807* (2013.01); *H01L 27/0207* (2013.01); *H01L 2027/11831* (2013.01)
USPC .................. 257/369; 257/206; 257/E27.062; 257/E27.067; 257/E27.108; 257/E21.632; 438/199

(58) Field of Classification Search
USPC .................. 257/369, 206, E27.062, E27.067, 257/E27.108, E21.632; 438/199
See application file for complete search history.

(56) References Cited

U.S. PATENT DOCUMENTS

| | | | |
|---|---|---|---|
| 4,570,176 | A | 2/1986 | Kolwicz |
| 7,562,326 | B2 | 7/2009 | Wang et al. |
| 7,919,792 | B2 | 4/2011 | Law et al. |
| 8,039,874 | B2 * | 10/2011 | Eimitsu et al. ................ 257/206 |
| 2005/0116268 | A1 * | 6/2005 | Tahira et al. .................. 257/288 |
| 2006/0186478 | A1 | 8/2006 | Hughes et al. |
| 2008/0283871 | A1 | 11/2008 | Hamada |
| 2009/0256180 | A1 | 10/2009 | Azuma |
| 2010/0133625 | A1 * | 6/2010 | Hamada ........................ 257/369 |
| 2011/0073953 | A1 * | 3/2011 | Nishimura et al. ........... 257/369 |

(Continued)

OTHER PUBLICATIONS

International Search Report and Written Opinion—PCT/US2013/068334—ISA/EPO—Jan. 27, 2014.

(Continued)

*Primary Examiner* — Victor A Mandala
(74) *Attorney, Agent, or Firm* — Paul S. Holdaway (57) ABSTRACT

A semiconductor standard cell includes an N-type diffusion area and a P-type diffusion area, both extending across the cell and also outside of the cell. The cell also includes a conductive gate above each diffusion area to create a semiconductive device. A pair of dummy gates are also above the N-type diffusion area and the P-type diffusion area creating a pair of dummy devices. The pair of dummy gates are disposed at opposite edges of the cell. The cell further includes a first conductive line configured to couple the dummy devices to power for disabling the dummy devices.

20 Claims, 8 Drawing Sheets

(56) References Cited

U.S. PATENT DOCUMENTS

| | | | |
|---|---|---|---|
| 2011/0089534 A1* | 4/2011 | Lee et al. | 257/545 |
| 2011/0177658 A1* | 7/2011 | Law et al. | 438/129 |
| 2013/0256809 A1* | 10/2013 | Liu et al. | 257/401 |
| 2013/0292777 A1* | 11/2013 | Liaw | 257/369 |
| 2014/0001563 A1* | 1/2014 | Rashed et al. | 257/369 |

OTHER PUBLICATIONS

Krishna B et al., "Diffusion Sharing Across Cell Boundaries in Cell Based Design," Circuits and Systems, 1996., IEEE 39th Midwest symposium on Ames, IA, USA Aug. 18-21, 1996, 19960818; 19960818-19960821 New York, NY, USA,IEEE, US, vol. 1, XP010222891, pp. 349-352, ISBN 978-0/7803-3636-0.

* cited by examiner

SHARED-DIFFUSION STANDARD CELL ARCHITECTURE

TECHNICAL FIELD

The present disclosure relates generally to a standard cell architecture. More specifically, the disclosure relates to a shared-diffusion standard cell architecture.

BACKGROUND

In a standard cell architecture, oxide definition (OD) (e.g., diffusion) areas are contained within a cell area. That is, the diffusion areas are within the cell and do not extend beyond (or even near) cell edges. Active devices associated with the diffusion areas are also located within the cell boundaries. Typically, devices at edges of a diffusion area show a performance degradation. For example, devices fabricated with a 20 nm process technology may have a thirty percent performance degradation. The degradation may result from a reduced Silicon Germanium (SiGe) deposition at the diffusion edges. The reduced Silicon Germanium results in less stress on a device channel region. Thus, conventional cell layouts have avoided placement of active devices at the diffusion area edges.

Dummy fields of pure oxide (PO) may be at the cell edges. These dummy fields may be referred to as dummy gates. The dummy gates (PO) are not associated with diffusion areas. Because the dummy gates are not associated with diffusion areas, the dummy gates are not part of active devices. Therefore, active devices are not provided on the cell edges.

Figure 1:
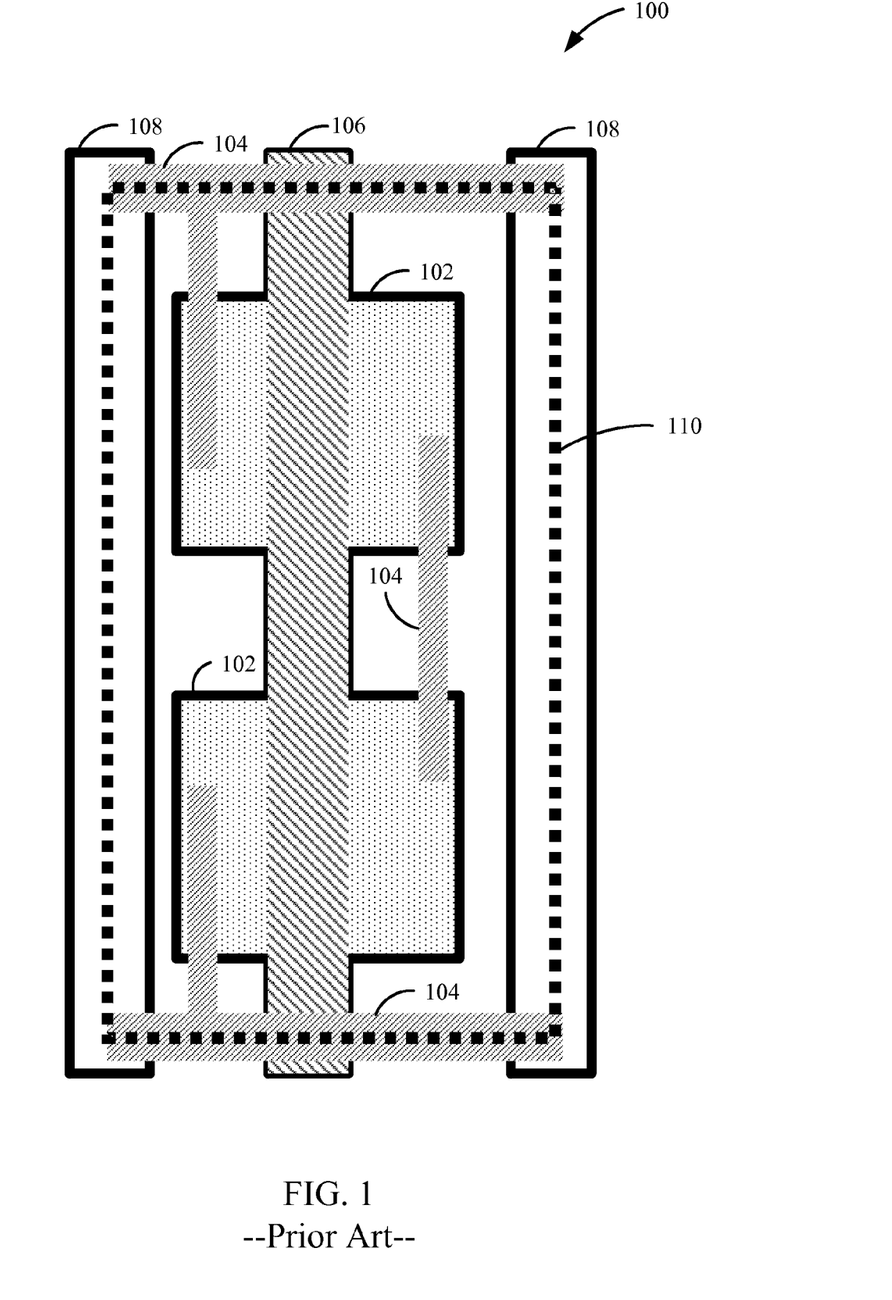
FIG. 1 illustrates a prior art standard cell architecture.

FIG. 1 illustrates a conventional standard cell architecture 100. The conventional cell 100 includes diffusion areas 102, conductive (e.g., metal) lines 104, a polysilicon gate 106, dummy gates 108, and a cell boundary 110. In the conventional cell 100, the dummy gates 108 are not active devices because they do not overlap with the diffusion areas 102.

SUMMARY

According to an aspect, a semiconductor standard cell is presented. The cell includes an N-type diffusion area extending across the cell and also outside of the cell, and a P-type diffusion area extending across the cell and also outside of the cell. The cell also includes a polyline above each diffusion area to create a semiconductive device. The cell further includes a pair of dummy polylines, each dummy polyline disposed above the N-type diffusion area and the P-type diffusion area to create a pair of dummy devices. The pair of dummy polylines are disposed at opposite edges of the cell. The cell also has a conductive line configured to couple one of the dummy devices to power, disabling the dummy device.

According to another aspect, a semiconductor cell fabrication method is presented. The method includes fabricating an N-type diffusion area extending across the cell and also outside of the cell, and fabricating a P-type diffusion area extending across the cell and also outside of the cell. The method also includes fabricating a polyline above each diffusion area to create a semiconductive device. The method further includes fabricating a pair of dummy polylines, each dummy polyline disposed above the N-type diffusion area and the P-type diffusion area to create a pair of dummy devices. The pair of dummy polylines are disposed at opposite edges of the cell. The method still further includes fabricating a conductive line configured to couple one of the dummy devices to power for disabling the dummy device.

According to yet another aspect, a semiconductor standard cell is presented. The cell includes a P-type diffusion area extending across the cell and also outside of the cell, and an N-type diffusion area extending across the cell and also outside of the cell. The cell also includes a conductive gate above each diffusion area to create a semiconductive device. The cell further includes a pair of dummy gates, each dummy gate disposed above the N-type diffusion area and the P-type diffusion area to create a pair of dummy gates. The pair of dummy gates are disposed at opposite edges of the cell. The cell also has a conductive means for coupling at least one of the dummy gates to power for disabling the at least one dummy device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

It is desired to provide a standard cell architecture that improves performance without additional current leakage. Proposed are standard cell library architectures that improve performance by extending diffusion areas beyond cell boundaries. The extended diffusion are of the active device under the cell edge improves the mobility of the device without proportionate increased leakage. Furthermore, the proposed architecture improves the cell switching as a result of the improved mobility. It should be noted that a polysilicon gate (also referred to as a polyline) on a cell edge may form an active device once a diffusion area is provided under the polyline. According to aspects of the present disclosure, the potentially active devices are deactivated, creating dummy devices.

Figure 2:
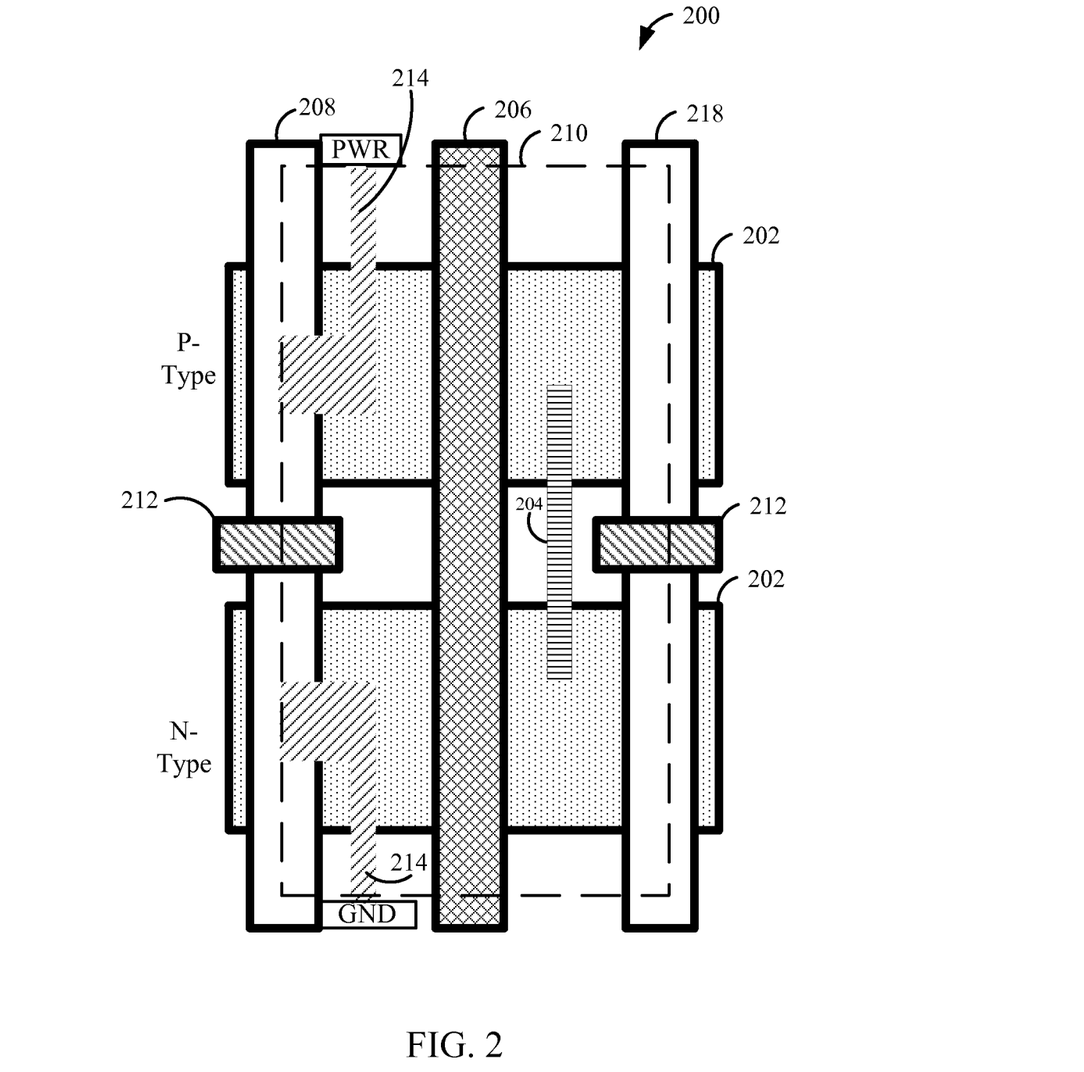
FIGS. 2 and 3 illustrate a standard cell architecture according to aspects of the present disclosure.

FIG. 2 illustrates a standard cell architecture according to an aspect of the present disclosure. As illustrated in FIG. 2, the cell 200 includes diffusion areas 202, an output tab 204, a polyline gate 206, a tied off dummy gate 208, an un-tied off dummy gate 218, a cell boundary 210, polyline cut masks 212, and gate tie offs (conductive lines) 214. The gate tie offs 214 are in contact with both the tied off dummy gate 208 and the portion of the diffusion areas 202 defined between the polyline gate 206 and the tied off dummy gate 208. The intersection of the tied off dummy gate 208 and the upper (p-type) diffusion area 202 form a first dummy device and the intersection of the tied off dummy gate 208 and the lower (n-type) diffusion area 202 form a second dummy device. The cell 200 may be referred to as a one finger cell and typically has a power supply on one side of the cell 200.

As shown in FIG. 2, the diffusion areas 202 extend beyond the cell boundary (edge) 210 and could potentially form active devices with the dummy gates 208 and 218. Furthermore, the dummy gates 208 and 218 are defined on the cell boundary 210 so that each dummy gate 208 and 218 extends beyond the cell boundary 210. Because each dummy gate 208 and 218 extends beyond the cell boundary 210, each dummy gate 208 and 218 may be shared with another cell that abuts the cell 200 (seen better in FIG. 4A, discussed below).

A power supply (PWR) and a ground source (GND) are provided on one side of the cell 200. Thus, dummy gates 208 on that side can be tied off (e.g., turned off/deactivated) with gate tie offs (conductive lines) 214. More specifically, the dummy gate 208 is coupled to the power supply (PWR) with one tie off 214 and is coupled to ground (GND) with another tie off 214. The dummy gate 208 is coupled to both the power supply (PWR) and ground (GND) because the polyline cut masks 212 separate the cell (including the dummy gate 208), into PMOS and NMOS regions. For example, the upper diffusion area 202 could be a P-type diffusion area and the lower diffusion area 202 could be an N-type diffusion area. Thus, the PMOS and NMOS portions of the tied off dummy gate 208 (i.e., cut dummy polylines) are turned off by tying one of the gate tie offs 214 to ground (GND) and the other one of the gate tie offs 214 to the power supply (PWR). It should be noted that the polyline gate 206 is also coupled to a signal line.

As discussed above, in a one finger cell architecture, such as the cell 200, the gate tie offs 214 are placed on one edge of the cell because the power supply is only available on one side of the cell. For example, as illustrated in FIG. 2, the gate tie offs 214 are placed on the left edge of the cell 200. A cell architecture with only one tied off dummy gate may also be referred to as an asymmetrical architecture.

Figure 4A:
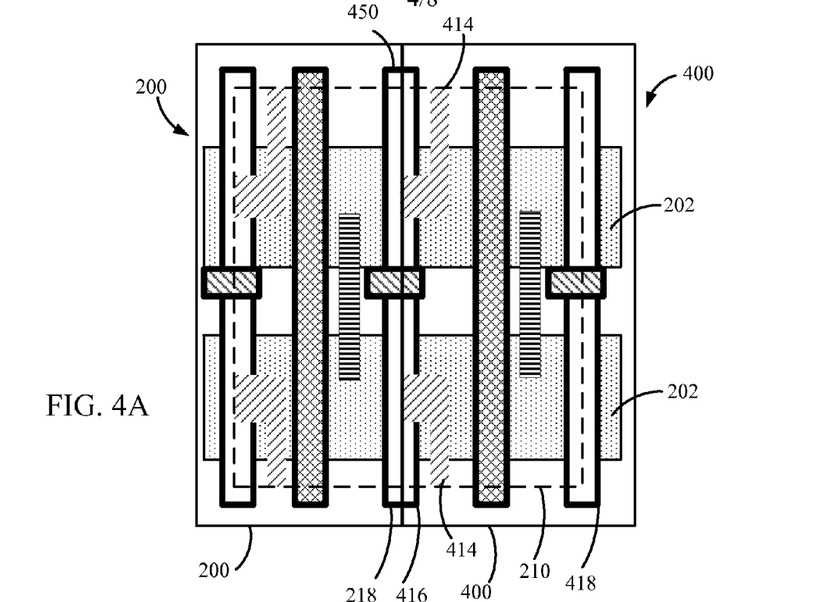
FIGS. 4A-4B illustrate standard cell placements according to aspects of the present disclosure.

The standard cell may not function properly if any of the dummy gates are active. Thus, placement of the cells is restricted so that all dummy gates are disabled, as seen in FIG. 4A. That is, in a one finger cell, such as the cell 200 of FIG. 2, the un-tied off dummy gate 218 on the right edge may be turned off by abutting the cell 200 with a tied off dummy gate 416 of another cell 400. Specifically, the tied off dummy gate 416 of the adjacent cell 400 abuts the un-tied off dummy gate 218 of the cell 200, and therefore, the un-tied off dummy gate 218 is turned off by the gate tie offs 414.

Because two asymmetrical cells 200 and 400 are placed adjacent to each other, the un-tied off dummy gate 218 of the first asymmetrical cell 200 and the tied off dummy gate 416 of the second asymmetrical cell 400 form a combined dummy gate 450. That is, a portion of the un-tied off dummy gate 218, such as for example half of the un-tied off dummy gate 218, and a portion of the tied off dummy gate 416, such as for example half of the tied off dummy gate 416, form the combined dummy gate 450. Furthermore, the tied off dummy gate 416 of the second asymmetrical cell 400 also ties off the un-tied off dummy gate 218 of the first asymmetrical cell 200 so that the combined dummy gate 450 is tied off Furthermore, as shown in FIG. 4A, because the diffusion areas 202 of each cell 200 and 400 extend beyond the cell boundaries 210 of each cell 200 and 400, the diffusion areas 202 of each cell 200 and 400 couple with each other. The placement of the cells 200 and 400 illustrated in FIG. 4A is permissible because each dummy gate 208, 218, 416, 418, and 450 will be turned off. It should be noted that the un-tied off dummy gate 418 of the asymmetrical cell 400 is specified to be tied off by a tied off dummy gate of another asymmetrical cell or another symmetrical cell (not shown).

Figure 3:
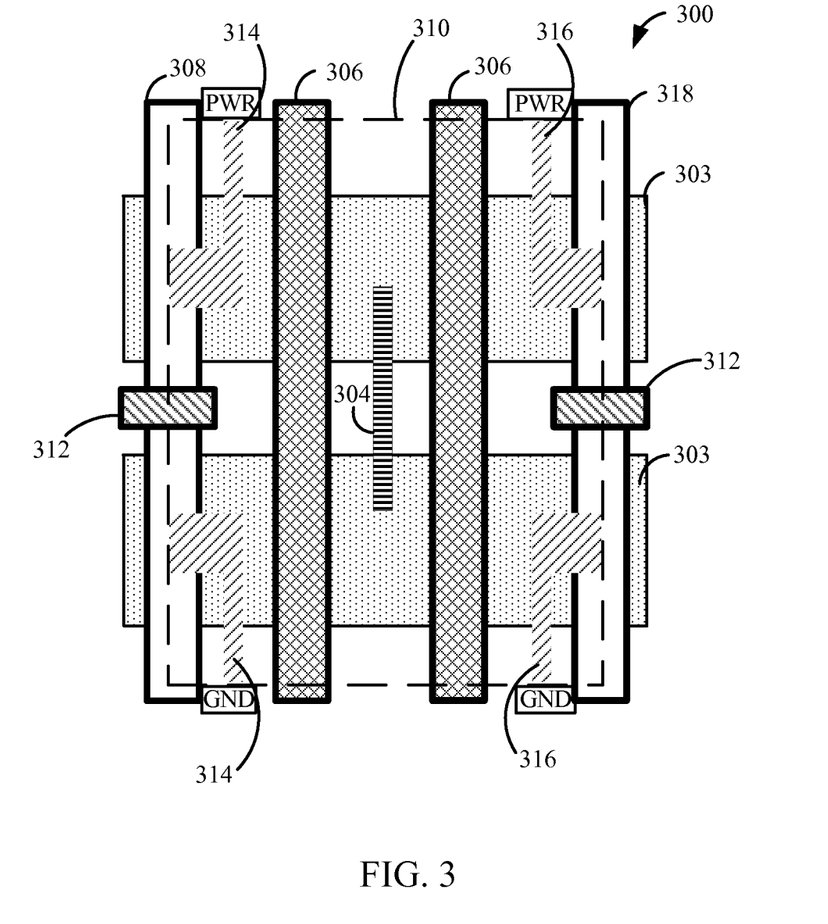

FIG. 3 illustrates a standard cell architecture according to another aspect of the present disclosure. As illustrated in FIG. 3, the cell 300 includes diffusion areas 303, an output tab 304, polyline gates 306, a right edge dummy gate 318, a left edge dummy gate 308, a cell boundary 310, polyline cut masks 312, left edge gate tie offs 314, and right edge gate tie offs 316. The cell 300 may be referred to as a two finger cell architecture.

According to one aspect, as shown in FIG. 3, both the right edge dummy gate 318 and the left edge dummy gate 308 may be tied off. The right edge dummy gate 318 may be tied off via right edge gate tie offs 316, and the left edge dummy gate 308 may be tied off via left edge gate tie offs 314. It should be noted that in a two finger cell architecture, a supply may be provided on both sides of the cell, and therefore, both dummy gates can be tied off. The two finger cell architecture, such as the cell 300 of FIG. 3, may be referred to as a symmetrical cell.

Figure 4B:
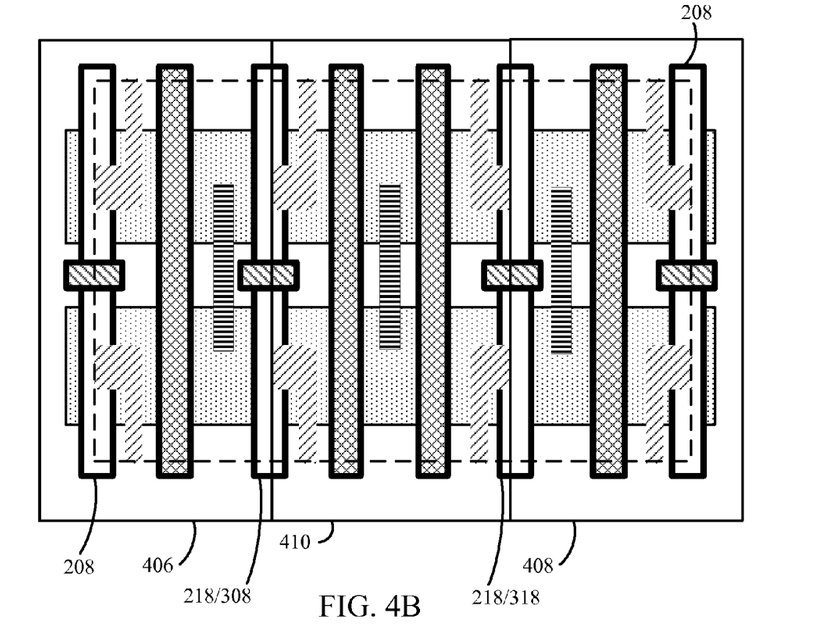

As discussed above, the standard cells are placed in a manner so that all of the dummy gates are turned off. FIG. 4B illustrates another exemplary cell placement. Two asymmetric cells 406 and 408 may be placed on each side of a symmetric cell 410. The asymmetric cell 408 may be flipped relative to the asymmetric cell 406 so that the un-tied off dummy gate 218 of the asymmetric cell 408 is abutted by the right edge dummy gate 318 of the symmetric cell 410. That is, the un-tied off dummy gate 218 of the asymmetric cell 408 may be turned off by the right edge dummy gate 318 of the symmetric cell 410.

Moreover, the asymmetric cell 406 is placed in a manner so that the un-tied off dummy gate 218 of the asymmetric cell 406 is abutted by the left edge dummy gate 308 of the symmetric cell 410. That is, the un-tied off dummy gate 218 of the asymmetric cell 406 may be turned off by the left edge dummy gate 308 of the symmetric cell 410. Accordingly, by placing the asymmetric cells 406 and 408 on either side of a symmetric cell 410, the un-tied off dummy gates 218 of the asymmetric cells 406 and 408 may be turned off. That is, the placement of the cells 406, 408, and 410 is permissible because all of the dummy gates 208, 218, 308, and 318 are tied off (e.g., disabled). It should be noted that the structure of the asymmetric cells 406 and 408 is similar to the structure of the asymmetric cell 200 shown in FIG. 2. Moreover, the structure of the symmetric cell 410 is similar to the structure of the symmetric cell 300 shown in FIG. 3.

Figure 4C:
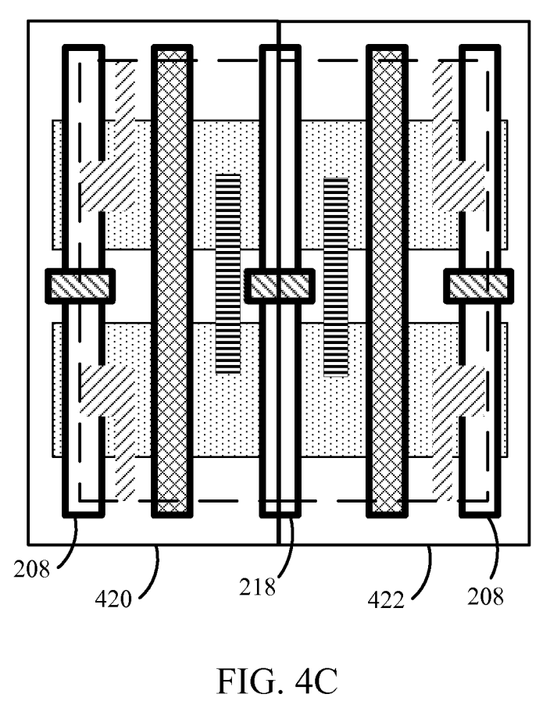
FIG. 4C illustrates a prohibited standard cell placements according to aspects of the present disclosure.

FIG. 4C illustrates a placement of cells that is not permissible according to aspects of the present disclosure. As illustrated in FIG. 4C, two asymmetric cells 420 and 422 are placed adjacent to each other. One of the asymmetric cells 422 is flipped relative to the asymmetric cell 420, and therefore, the un-tied off dummy gates 218 of the asymmetric cells 420 and 422 abut each other. That is, the tied off dummy gates 208 of the asymmetric cells 420 and 422 do not abut an un-tied off dummy gate 218. Because both of the un-tied off dummy gates 218 of the asymmetric cells 420 and 422 abut each other, the un-tied off dummy gates 218 cannot be tied off and may form active devices that may cause the cell to function improperly. Therefore, because the placement of the cells 420 and 422 does not tie off all of the dummy gates, the placement illustrated in FIG. 4C is not permissible according to aspects of the present disclosure. It should be noted that the structure of the asymmetric cells 420 and 422 is similar to the structure of the asymmetric cell 200 shown in FIG. 2.

Figure 5:
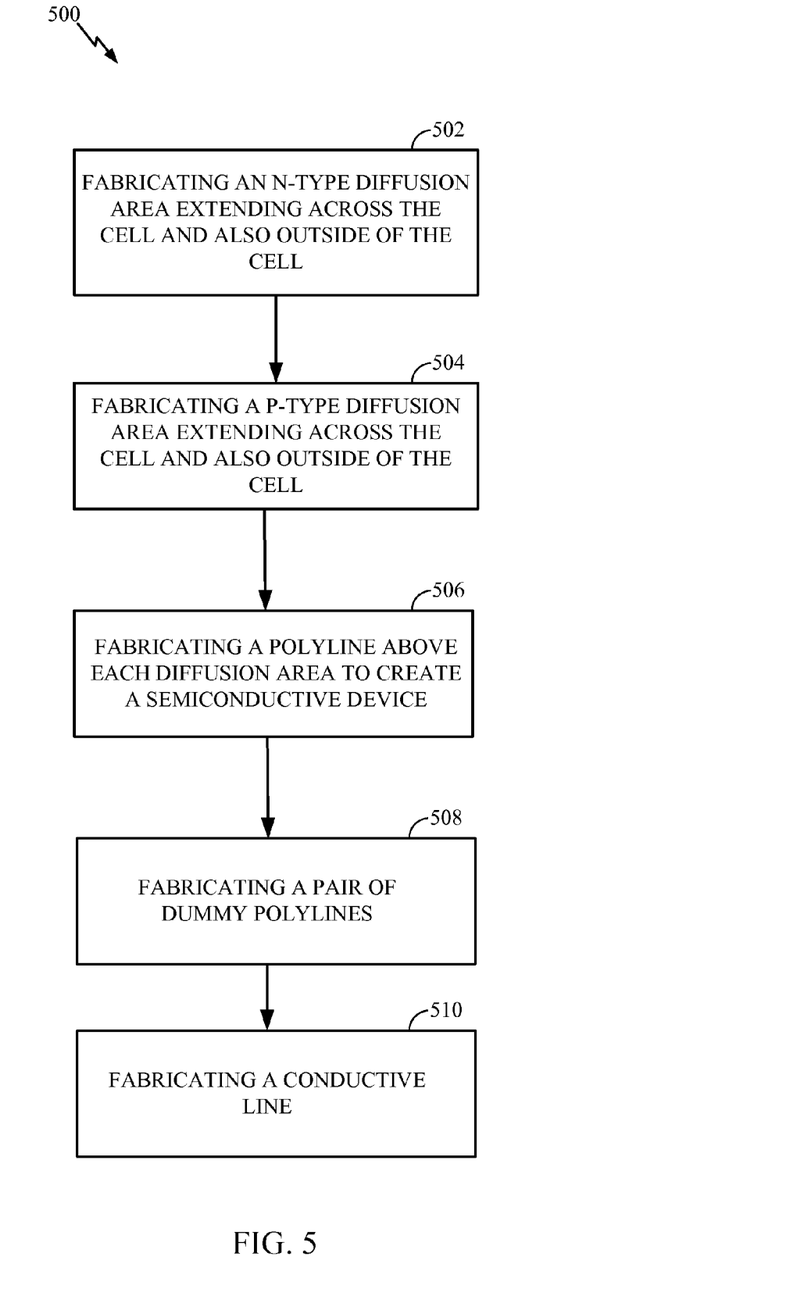
FIG. 5 illustrates a block diagram of a method for fabricating a standard cell architecture according to an aspect of the present disclosure.
Figure 6:
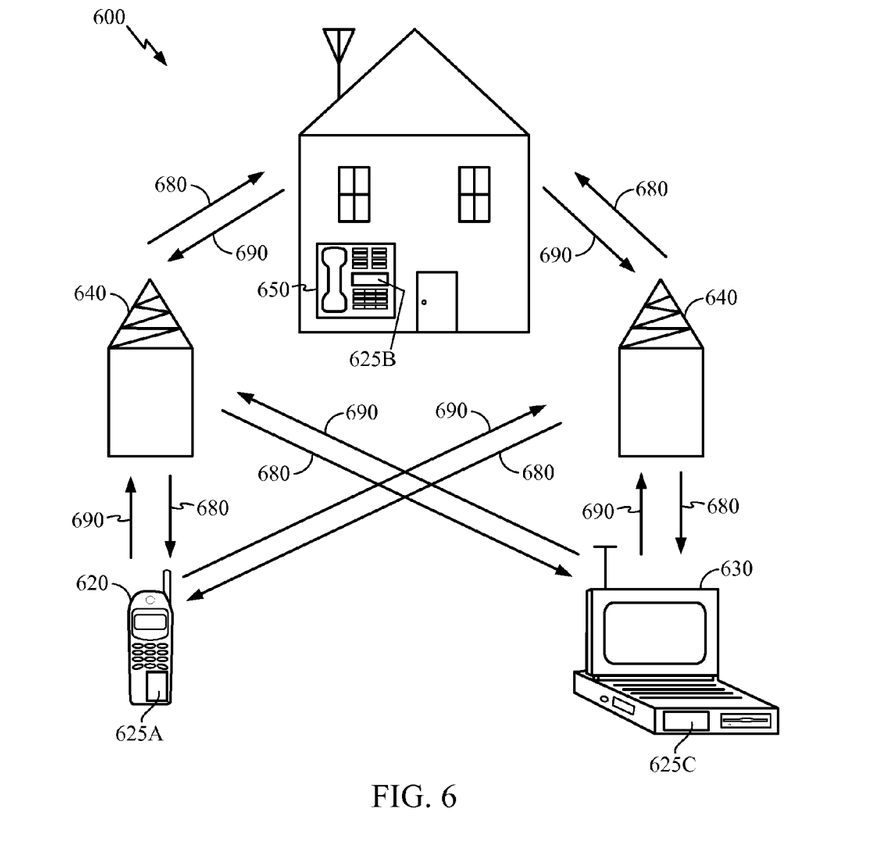
FIG. 6 illustrates an exemplary wireless communication system in which a configuration of the disclosure may be advantageously employed.

FIG. 5 illustrates a block diagram of a method for fabricating semiconductor standard cell 500. As illustrated in FIG. 5, in block 502, an N-type diffusion area extending across the cell and also outside of the cell is fabricated. In block 504, a P-type diffusion area extending across the cell and also outside of the cell is fabricated. Furthermore, in block 506, a polyline is fabricated above each diffusion area to create a semiconductive device. Moreover, in block 508 a pair of dummy polylines are fabricated. Each dummy polyline is disposed above the N-type diffusion area and the P-type diffusion area to create a pair of dummy devices, the pair of dummy polylines being disposed at opposite edges of the cell. Finally, at block 510 a conductive line is fabricated. The conductive line configured to couple at least one of the dummy devices to power for disabling the at least one dummy device FIG. 6 shows an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include multi-core processors with semiconductor standard cell 625A, 625B, 625C. FIG. 6 shows forward link signals 680 from the base stations 640 and the remote units 620, 630, and 650 and reverse link signals 660 from the remote units 620, 630, and 650 to base stations 640.

In FIG. 6, the remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 6 illustrates remote units, which may employ multi-core processors with semiconductor standard cell 625A, 625B, 625C according to the teachings of the disclosure, the disclosure is not limited to these exemplary illustrated units. For instance, multi-core processors with a semiconductor standard cell according to aspects of the present disclosure may be suitably employed in any device.

Figure 7:
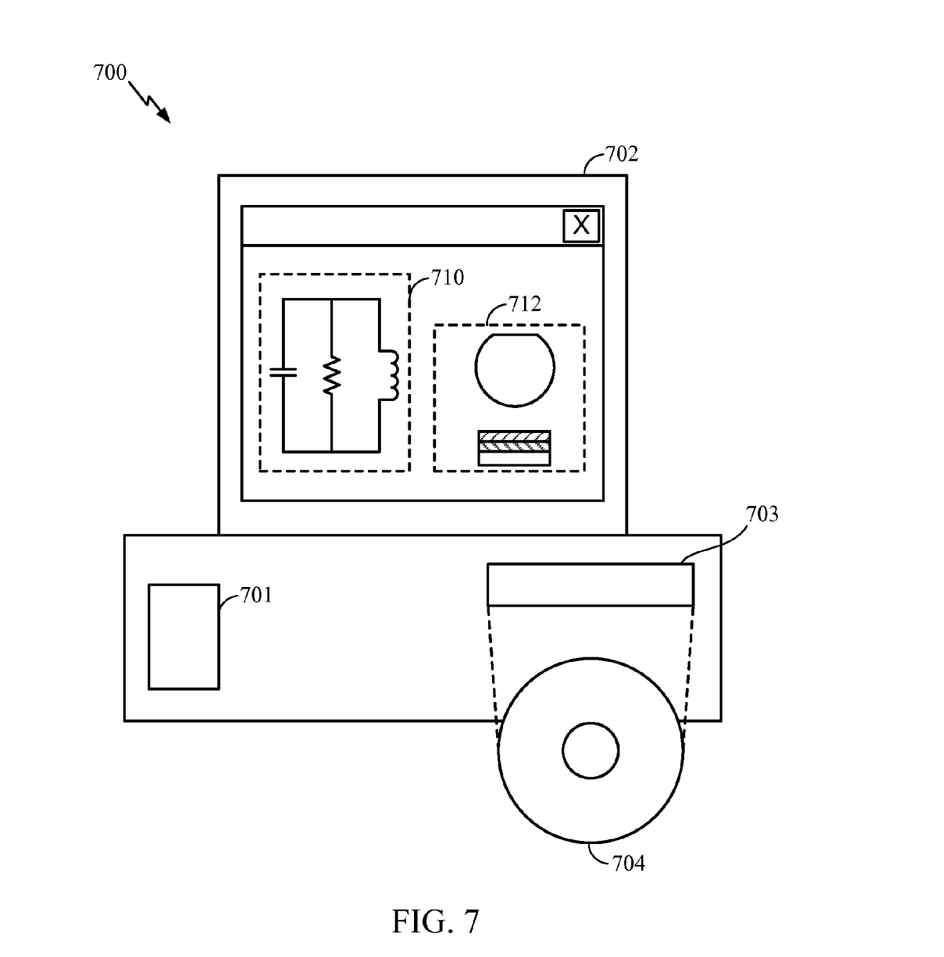
FIG. 7 is a block diagram illustrating a design workstation used for circuit, layout, and logic design of a semiconductor component according to one aspect of the present disclosure.

FIG. 7 is a block diagram illustrating a design workstation used for circuit, layout, and logic design of a semiconductor component, such as the multi-core processor with a semiconductor standard cell disclosed above. A design workstation 700 includes a hard disk 701 containing operating system software, support files, and design software such as Cadence or OrCAD. The design workstation 700 also includes a display 702 to facilitate design of a circuit 710 or a semiconductor component 712 such as a semiconductor standard cell. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

In one configuration, a capacitor comprises a first diffusion means. In one aspect, the first diffusion means may be an N-type diffusion area configured to perform the functions recited by the first diffusion means. The capacitor is also configured to include a second diffusion means. In one aspect, the second diffusion means may be a P-type diffusion area configured to perform the functions recited by the second diffusion means. The capacitor is further configured to include a conductive means. In one aspect, the conductive means may be a conductive line configured to perform the functions recited by the second diffusion means. In another aspect, the aforementioned means may be any module or any apparatus configured to perform the functions recited by the aforementioned means.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A semiconductor standard cell, comprising:
    an N-type diffusion area extending across the cell and also outside of the cell;
    a P-type diffusion area extending across the cell and also outside of the cell;
    at least one conductive gate above each diffusion area to create a semiconductive device;
    a pair of dummy gate, each dummy gate disposed above the N-type diffusion area and the P-type diffusion area to create at least a pair of dummy devices, the pair of dummy gates being disposed at opposite edges of the cell; and
    at least one first conductive line configured to couple at least one of the dummy devices to power for disabling the at least one dummy device.

2. The cell of claim 1, in which the at least one dummy device coupled to the at least one first conductive line is disposed on only one edge of the cell.

3. The cell of claim 1, in which the at least one dummy device coupled to the at least one first conductive line comprises the pair of dummy devices coupled to a plurality of conductive lines, the pair of dummy devices being disposed at opposite edges of the cell.

4. The cell of claim 3, in which the at least one conductive gate comprises a plurality of conductive gates above each diffusion area; and
    the cell further comprises an output tab disposed between the plurality of conductive gates.

5. The cell of claim 1, in which each dummy gate comprises a pair of cut dummy gates, each cut dummy gate being associated with either the P-type diffusion area or the N-type diffusion area.

6. The cell of claim 5, in which each cut dummy gate forms a part of a P-type dummy device or an N-type dummy device.

7. The cell of claim 1, further comprising at least one second conductive line configured to couple at least one of the dummy devices to ground, disabling the at least one dummy device.

8. A semiconductor cell fabrication method, comprising:
    fabricating an N-type diffusion area extending across the cell and also outside of the cell;
    fabricating a P-type diffusion area extending across the cell and also outside of the cell;
    fabricating at least one conductive gate above each diffusion area to create a semiconductive device;
    fabricating a pair of dummy gates, each dummy gate disposed above the N-type diffusion area and the P-type diffusion area to create at least a pair of dummy devices, the pair of dummy gates being disposed at opposite edges of the cell; and
    fabricating at least one first conductive line configured to couple at least one of the dummy devices to power for disabling the at least one dummy device.

9. The method of claim 8, in which fabricating the at least one first conductive line comprises coupling the at least one dummy device to the at least one first conductive line so that the at least one dummy device is disposed on only one edge of the cell.

10. The method of claim 8, further comprising coupling the pair of dummy devices to a plurality of conductive lines, the pair of dummy devices being disposed at opposite edges of the cell.

11. The method of claim 10, in which the at least one conductive gate comprises a plurality of conductive gates above each diffusion area; and
    the method further comprises fabricating an output tab disposed between the plurality of conductive gates.

12. The method of claim 8, further comprising cutting the dummy gate to fabricate a pair of cut dummy gates, each cut dummy gate being associated with either the P-type diffusion area or the N-type diffusion area.

13. The method of claim 12, in which each cut dummy gate forms a part of a P-type dummy device or an N-type dummy device.

14. The method of claim 8, further comprising fabricating at least one second conductive line; and coupling at least one of the dummy devices to ground via the at least one second conductive line to disable the at least one dummy device.

15. A semiconductor standard cell, comprising:
- an N-type diffusion area extending across the cell and also outside of the cell;
- a P-type diffusion area extending across the cell and also outside of the cell;
- at least one conductive gate above each diffusion area to create a semiconductive device;
- a pair of dummy gates, each dummy gate disposed above the N-type diffusion area and the P-type diffusion area to create at least a pair of dummy devices, the pair of dummy devices being disposed at opposite edges of the cell; and
- at least one conductive means for coupling at least one of the dummy devices to power for disabling the at least one dummy device.

16. The cell of claim 15, in which the at least one dummy device coupled to the at least one first conductive means is disposed on only one edge of the cell.

17. The cell of claim 15, in which the at least one dummy device coupled to the at least one first conductive means comprises the pair of dummy devices coupled to a plurality of conductive means, the pair of dummy devices being disposed at opposite edges of the cell.

18. The cell of claim 17, in which the at least one conductive gate comprises a plurality of conductive gates above each diffusion area; and
- the cell further comprises means for outputting a signal, the outputting means disposed between the plurality of conductive gates.

19. The cell of claim 15, in which each dummy gate comprises a pair of cut dummy gates, each cut dummy gate being associated with either the N-type diffusion or the P-type diffusion area.

20. The cell of claim 19, in which each cut dummy gate forms a part of an N-type dummy device or a P-type dummy device.

* * * * *